United States Patent [19]

Neu

[11] Patent Number: 5,086,240
[45] Date of Patent: Feb. 4, 1992

[54] PROGRAMMABLE INTEGRATED LOGIC NETWORK HAVING BIPOLAR AND MOS TRANSISTORS

[75] Inventor: Georges Neu, Mareil Sur Mauldre, France

[73] Assignee: Bull S.A., Paris, France

[21] Appl. No.: 588,547

[22] Filed: Sep. 26, 1990

[30] Foreign Application Priority Data

Sep. 28, 1989 [FR] France .................. 89 12679

[51] Int. Cl.$^5$ .................................. H03K 19/177
[52] U.S. Cl. .................................. 307/465; 307/446
[58] Field of Search ............... 307/443, 446, 465, 466, 307/468, 370; 365/189.08, 104

[56] References Cited

U.S. PATENT DOCUMENTS

| | | | |
|---|---|---|---|
| 4,409,499 | 10/1983 | Zapisek et al. | 307/468 |
| 4,725,745 | 2/1988 | Kondo et al. | 307/465 |
| 4,798,977 | 1/1989 | Sakui et al. | 307/446 |

FOREIGN PATENT DOCUMENTS 0116287 8/1984 European Pat. Off. .

OTHER PUBLICATIONS

IBM Technical Disclosure Bulletin, vol. 24, No. 5, Oct. 1981, pp. 2424–2425, New York, T. Winlow.
IBM Technical Disclosure Bulletin, vol. 17, No. 10, Mar. 1975, pp.2957–2985, New York, G. J. Kelly et al.
IBM Technical Disclosure Bulletin, vol. 26, No. 11, Apr. 1984, pp. 5835–5837, New York, M. Cases et al.
VLSI Design, Dec. 1983, pp. 56–63, J. A. Sutton, "The 80C86 CMOS Design from the nMos Architecture".

*Primary Examiner*—David Hudspeth
*Attorney, Agent, or Firm*—Kerkam, Stowell, Kondracki & Clarke

[57] ABSTRACT

Each programming point (11) of the programmable logic network (10) according to the invention is made with a field effect transistor (N1), the gate and drain of which are connected respectively to the input (Lx) and output (Ly) lines, and the source of which is connected both to the reference potential, via the drain-to-source path of a second field effect transistor (N2), the gate of which is connected to the output line (Ly), and to the base of a bipolar transistor Q, the emitter-to-collector path of which is disposed between the ground and output lines. A network according to the invention has an increased operating speed and can be used in a read-only memory or in PLA circuits.

6 Claims, 2 Drawing Sheets

PROGRAMMABLE INTEGRATED LOGIC NETWORK HAVING BIPOLAR AND MOS TRANSISTORS

FIELD OF THE INVENTION

The subject of the invention is a programmable integratable logic network, including input lines that intersect with output lines by way of programming points. The invention relates to logic networks, each of the programming points of which includes a field effect transistor, such as an MOS (metal oxide semiconductor) transistor. More precisely, in a programming point between an input line and an output line of the network, the gate and drain of the field effect transistor are connected to the input line and output line, respectively, and its source is connected to a reference potential, such as ground. The types of integrated programmable logic networks to which the invention relates are programmable logic array (PLA) circuits, and read-only memories (ROMs).

BACKGROUND OF THE INVENTION

Current research in the field of PLA circuits is directed to increasing their operating speed. One solution adopted is to associate bipolar transistors with the field effect transistors of the logic network. This technology is currently known as BiMOS, or BiCMOS in the case of a CMOS environment (complementary MOS). In the conventional manner, a PLA circuit essentially comprises a matrix of logic products, or AND matrix, which receives the input signals of the PLA circuit, and a logical sum matrix or OR matrix, which receives the output signals of the AND matrix and furnishes the output signals of the PLA circuit. By a known method, each programming point of the AND matrix is embodied by a field effect transistor, mounted as noted above, while each programming point of the OR matrix is embodied by a bipolar transistor provided with a plurality of collectors, equal in number to the plurality of output lines of the PLA circuit, in accordance with IIL technology (integrated injection logic).

This BiMOS PLA circuit has the advantage of being highly integrated. Nevertheless, the bipolar transistors which assure maximum speed of the PLA circuit are concentrated exclusively in the output matrix of the PLA circuit, that is, the OR matrix. Furthermore, a static current is present in a circuit of the IIL type. The increase in speed of the BiMOS PLA circuit is thus improved only very slightly. Furthermore, the dimensioning of the field effect transistor in each programming point of the input matrix presents a difficult problem. In theory, rapid operation requires a large-sized field effect transistor. However, a large-sized transistor has an even higher capacitance. A matrix embodied by large field effect transistors would thus be a set of strong capacitors, mounted in parallel between ground and each input line, and between ground and each output line. Added together, these high capacitances would cause a major slowdown in the switching of the input lines and the discharging of the output lines. In conclusion, the presence of large field effect transistors in a programmable logic network means that they lose their speed and their large scale of integration. This explains why in practice a programmable logic network of the conventional type is embodied by small field effect transistors, which make its operation relatively slow, yet retain the advantage of large scale integration.

OBJECT AND SUMMARY OF THE INVENTION

The object of the invention is to achieve a very fast integrated programmable logic network that does not consume static energy, by making better use of the advantages of associating bipolar transistors with the field effect transistors used in the conventional manner.

According to the invention, an integratable programmable logic network including input lines that intersect with output lines via programming points, each of which includes a field effect transistor the gate and drain of which are respectively connected to one input line and one output line among these lines, and the source of which is connected to a reference potential, is characterized in that in each programming point, the source of the first field effect transistor is connected both to the reference potential, by way of the drain-to-source path of a second field effect transistor, the gate of which is connected to the output line, and to the base of a bipolar transistor, the emitter-to-collector path of which is disposed between the aforementioned input line and the aforementioned output line.

The characteristics and advantages of the invention will become more apparent from the ensuing description, which is given by way of example, taken in conjunction with the accompanying drawings.

DESCRIPTION OF THE PREFERRED EMBODIMENTS

Figure 1:
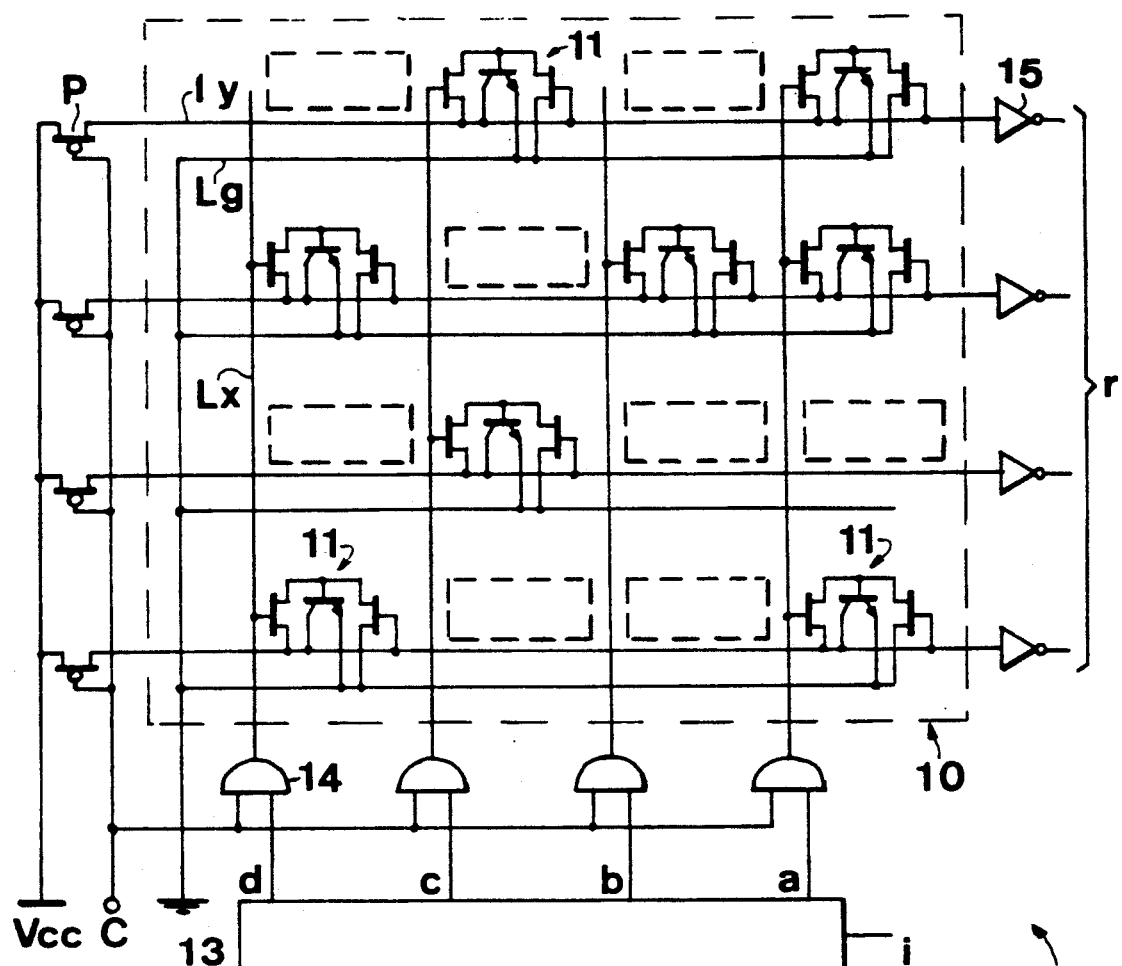
FIG. 1 is a schematic fragmentary illustration of a random access memory that includes a programmable logic network according to the invention.

FIG. 1 schematically and in highly simplified form illustrates an example of a programmable logic network 10. In the conventional manner, the network 10 is a matrix or grid made of input lines Lx which intersect with output lines Ly by way of programming points 11. The programming points each establish the desired or programmed link between one input line and one output line, to perform a predetermined logical function. In FIG. 1, the absence of a programming point 11 between an input line Lx and an output line Ly is indicated simply by a rectangle drawn in dashed lines. Also in the conventional manner, the programming points 11 are connected to a reference potential, such as ground, by way of a ground line Lg.

Figure 2:
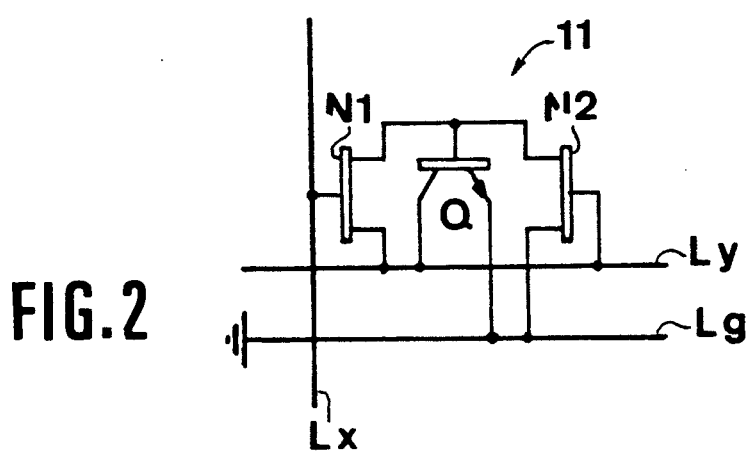
FIG. 2 is a detail view on a larger scale of a programming point of the programmable logic network shown in FIG. 1.

According to the invention, each programming point 11 has the structure shown in FIG. 1, and more clearly shown in FIG. 2. Turning to FIG. 2, it can be seen that each programming point 11 between an input line Lx and an output line Ly of the network 10 comprises two field effect transistors N1, N2 and one bipolar transistor Q. The field effect transistors used are n-channel MOS transistors with enrichment, and the bipolar transistor Q is of the n type. More precisely, the transistor N1 has its gate connected to the input line Lx and its drain connected to the output line Ly. The source of the transistor N1 is connected to the ground line Lg by way of the drain-to-source path of the transistor N2 that has its gate connected to the output line Ly. The bipolar transistor Q has its collector connected to the output line Ly, its emitter connected to the ground line Lg, and its base connected to the point joining the source of the transistor N1 to the drain of the transistor N2. The function of the programming points 11 in a programmable logic network 10 according to the invention will become apparent from the description of the apparatus shown in FIG. 1.

In FIG. 1, the network 10 according to the invention comprises the essential part of a read-only memory 12, in a BiCMOS environment. Reading of the read-only memory is done by applying an input signal i and receiving the output signal r. As usual, the input signal i is applied to a decoder 13, which in the example shown furnishes four input bits a, b, c, d. Each input line Lx of the network 10 is connected to the output of an AND gate 14, one input of which receives the precharging command signal C, and a second input of which receives a respective input bit a-d furnished by the decoder 13. Finally, the read-only memory 12 receives two supply potentials: ground, applied to the ground lines Lg of the network 10, and the potential Vcc, such as +5 V. Each output line Ly of the network 10 is connected to the source of a p-channel field effect transistor P with enrichment. For each transistor P, its drain is connected to the potential Vcc, and its gate receives the precharging command signal C. The output signal r of the read-only memory 12 is furnished by inverters 15 that are each applied to one output line Ly.

The function of the memory 12 is similar to that of a conventional memory. In a conventional memory, each programming point has only the transistor N1 shown in FIG. 2, the source of which is connected directly to the ground line Lg. The function to be described now includes a conventional precharging phase, followed by an evaluation phase. These phases are triggered by phase signals, not shown, which command the state of the precharging signal C. In the precharging phase, the precharging signal C has the value of logical "0" corresponding to ground potential. On the one hand, the precharging signal C commands the conduction of the transistors P, which put the output lines Ly at the potential Vcc. On the other hand, the precharging signal C applied to the AND gates 14 puts all the input lines Lx at the logical "0" state. Under these conditions, in each programming point 11, the transistor N1 is blocked and the transistor N2 is conducting. The conduction of the transistor N2 makes it possible to discharge the base of the bipolar transistor Q by way of the ground line Lg. When the evaluation phase is triggered, the precharging signal C assumes the value of logical "1". Under these conditions, the transistors P no longer conduct, and the AND gates 14 transmit the input bits a-d to the respective input lines Lx. The input bit a furnished by the decoder 13 will first be considered, and it will be assumed that it has the value of logical 0. The corresponding input Lx maintains the value of logical "0" of the precharging phase and thus maintains the state of the programming points 11 connected to the line Lx. The corresponding output lines Ly maintain their precharging potential. Now let it be supposed that the input bit a on the input line Lx has the value of logical "1". In each programming point 11 associated with the line Lx, the transistor N1 is made conductive and rapidly brings about the conduction of the bipolar transistor. The transistor N2 is blocked. The precharged output line Ly associated with the programming point 11 discharges through the bipolar transistor Q. The operation relative to the input bit a is naturally transposable to the other input bits b, c and d furnished by the decoder 13.

A first advantage of the invention is the rapid discharge of an output line Ly through the bipolar transistor Q of a programming point. Another advantage relates to the field effect transistors of each programming point. As explained above, the field effect transistor comprising each programming point of a conventional programmable logic network is small in size, so as not to increase the capacitance of the lines. However, network operation is slowed down by the small transistors. Thanks to the invention, the rapidity of the programmable logic network is obtained with small field effect transistors. The transistor N1 commands only the conduction of the bipolar transistor Q, which performs the discharge. The transistor N2 serves to discharge the base capacitance of the bipolar transistor Q. Consequently, in a programmable logic network according to the invention, each input line Lx still has a minimum capacitance. The result is a reduced switching time for each input line Lx, as a function of the input bits a-d furnished by the decoder 13. Generally, the factor of rapidity of a programmable logic network according to the invention is, on average, two and it may attain twice the value of a conventional memory 12 that has only the transistor N1 in each programming point.

However, it is clear that the presence of two additional transistors Q and N2 in each programming point 11 is to the detriment of the scale of integration of the memory 12. Hence the invention is advantageously applicable to the manufacture of read-only memories 12, with the principal object of lending high speed to the circuits that use them. The description below of the apparatus shown in FIG. 3 will provide a good illustration of all the advantages that can be gained from the characteristics of a programmable logic network 10 according to the invention.

Figure 3:
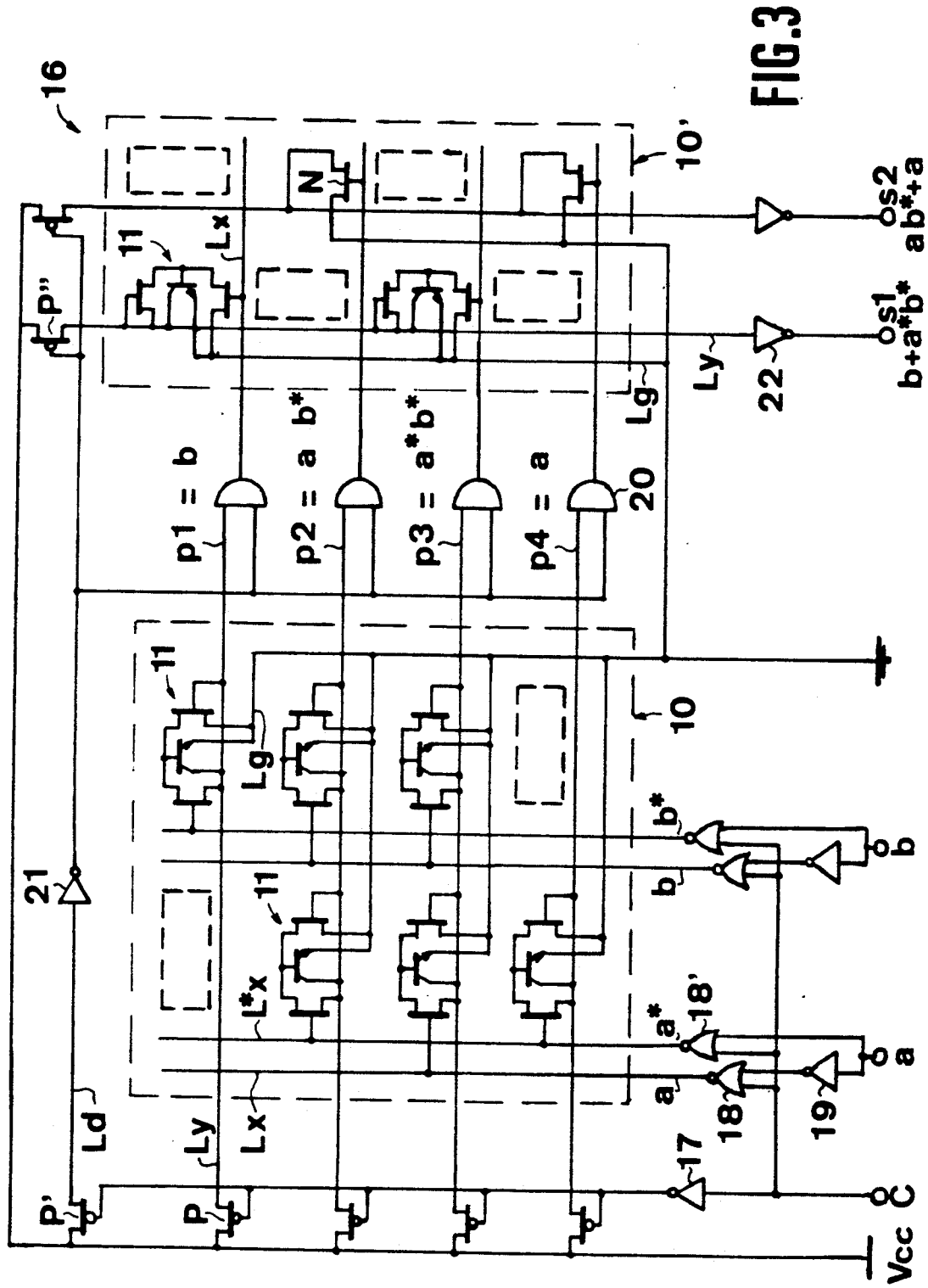
FIG. 3 is a schematic, fragmentary view of a PLA circuit that includes a programmable logic network according to the invention.

FIG. 3 shows two programmable logic networks 10, 10' according to the invention, which are assembled to comprise a PLA circuit 16. The circuit 16 shown is an autophased PLA designed in BiCMOS technology, such as that described in the article by Jim Sotton, "80C 86 CMOS design from the NMOS architecture" in the journal VLSI Design of December 1983. For simplicity in the drawings, the logic networks 10, 10' are shown highly reduced in size. The network 10 according to the invention is similar to the network 10 described above in conjunction with FIGS. 1 and 2. Generally, the elements common to both the PLA circuit 16 of FIG. 3 and the network 10 of FIG. 1 carry the same reference numerals or symbols. In particular, it will be noted that the ground lines Lg are connected to the input ground terminal of the PLA circuit 16. The potential Vcc (+5 V for example) is applied to the drains of a plurality of p-channel field effect transistors P with enrichment. Each output line Ly of the network 10 is connected to the source of a corresponding transistor P. The PLA circuit 16 also receives a precharging command signal C applied to the gates of the transistors P via an inverter 17. In the network 10, each input line Lx is associated with one complementary input line L*x representing the inverted logical value of the same input bit. Only two input bits a, b issuing from an input signal are shown, for the sake of simplicity in the drawings. Each pair of input lines Lx, L*x is connected to the corresponding output of two NOR gates 18, 18' having two inputs, of which one input is connected to receive the precharging command signal C. Each input bit a, b is applied to the second input of the NOR gate 18 via an inverter 19, and is applied directly to the second input of the NOR gate 18'. Finally, an additional transistor P' has its gate connected to the output of the inverter 17 that receives the precharging signal C; its drain is applied to the potential VCC, and its source is applied to a dummy line LD. The four output lines Ly shown in the network 10 furnish the respective logic products p1–p4 as a function of the position of the programming points 11 and their connection in the network 10. Some programming points 11 are connected to an input line Lx; other points 11 are connected to the input line L*x. The operation of the programming points 11 of the network 10 in the PLA circuit 16 is identical to that described in conjunction with FIGS. 1 and 2. In the example shown, p1=b, p2=ab*, p3=a*b*, and p4=a.

In the PLA circuit 16, the interface between the network 10 of the AND matrix and the network 10' of the OR matrix is made with AND gates 20 having two inputs, one input being connected to a corresponding output Ly of the network 10 and the other input being connected to the line Ld by way of an inverter 21. The outputs of the AND gates 20 are connected to the respective input lines Lx of the network 10'. Each of the two output lines Ly of the network 10' is connected to the source of a transistor P", the drain of which is connected to the potential Vcc and the gate of which is commanded by the output of the inverter 21 in the line Ld. The two output lines Ly shown in the network 10' furnish the two output signals s1, s2 to the output of respective inverters 22. All the programming points 11 are connected to the ground lines Lg. For simplicity in the drawings, the network 10' includes two variant embodiments of the programming points 11. The programming points 11 that furnish the signal s1 are identical to those shown in FIG. 2. In their arrangement shown, the signal s1=b+a*b*. In association with the output line that furnishes the signal s2, the programming points 11 are of the conventional type, including only a single transistor N equivalent to the transistor N1 of a programming point 11 according to the invention. In the arrangement shown, the signal s2=ab*+a.

It has been seen in conjunction with FIG. 1 that the network 10 according to the invention, which comprises the AND matrix of the PLA circuit 16 in FIG. 3, has very high-speed operation, compared with a conventional network using only a single MOS transistor per programming point. The first advantage of the invention is accordingly that a very fast AND matrix is furnished as an input matrix of the PLA circuit 16. The entire PLA circuit 16 can be very fast, if the network 10' of the OR matrix is also embodied according to the invention. However, as shown in conjunction with the output signal s2 of FIG. 3, the PLA circuit 16 is still very powerful even with a conventional network 10'. A good compromise is thus obtained between the increased space for the AND matrix and the speed of the PLA circuit 16.

In conclusion, a programmable logic network according to the invention has the following advantages: It minimizes the capacitance of the input lines Lx to attain rapid switching of potentials of these lines, as a function of the value of the input signals; it discharges the output lines Ly rapidly, so that they can have a relatively elevated capacitance; it does not consume static energy; and it lends itself to numerous variant embodiments and variant functions. For example, the network can be commanded by various phase signals, with or without a dummy line Ld.

What is claimed is:

1. In an improved integratable programmable logic network (10), comprising input lines (Lx), output lines (Ly), ground lines (Lg) and programming points (11), said input lines being operatively connected to intersect with said output lines through said programming points, said programming points, each including a first and a second field effect transistor (N1, N2), each having a gate electrode, connected respectively to one input line (Lx) and one output line (Ly), the first field effect transistor having a drain electrode connected to the output line (ly), the second field effect transistor having a source electrode connected to the ground line (Lg) and means for connecting the source of the first field effect transistor (N1) to the reference potential via the drain-to-source path of the second field effect transistor (N2), the gate of which is connected to said output line (Ly), and to the base of a bipolar transistor (Q), the emitter-to-collector path of which is connected between said ground line (Lg) and said output line (Ly).

2. The network as defined by claim 1, characterized in that it is incorporated into a read-only memory (ROM).

3. The network as defined by claim 1, characterized in that it comprises at least one of two matrices (AND, OR) of a PLA circuit (16).

4. A programmable logic network (10) comprising an input line, an output line, and a ground line, a first field effect transistor (N1), the drain of which is connected to the output line and the gate of which is connected to the input line (Lx), a second field effect transistor, the gate of which is connected to the output line (Ly), and the source of the first field effect transistor being connected both to the ground line, via the drain-to-source path of the second field effect transistor (N2), the gate of which is connected to the output line (Ly), and to the base of a bipolar transistor Q, the emitter-to-collector path of which is connected between the ground and output lines.

5. The network as defined by claim 4, characterized in that it is incorporated into a read-only memory (ROM).

6. The network as defined by claim 4, characterized in that it comprises at least one of two matrices (AND, OR) of a PLA circuit (16).

* * * * *